United States Patent [19]

Hechtman et al.

[11] Patent Number: 4,642,890
[45] Date of Patent: Feb. 17, 1987

[54] METHOD FOR ROUTING CIRCUIT BOARDS

[75] Inventors: Charles D. Hechtman, Plainsboro Township, Middlesex County; Zachary H. Levine, Lawrence Township, Mercer County, both of N.J.

[73] Assignee: AT&T Technologies, Inc., Berkeley Heights, N.J.

[21] Appl. No.: 793,618

[22] Filed: Oct. 31, 1985

[51] Int. Cl.⁴ ............................................. H05K 3/10
[52] U.S. Cl. .................................... 29/846; 364/488; 364/489
[58] Field of Search ................. 29/846; 364/488, 489, 364/491

[56] References Cited

U.S. PATENT DOCUMENTS

| | | | |
|---|---|---|---|
| 2,608,770 | 9/1952 | Hansford | 364/402 |
| 3,411,140 | 11/1968 | Halina et al. | 364/488 |
| 3,567,914 | 3/1971 | Neese et al. | 364/489 |
| 3,653,072 | 3/1972 | Ballas et al. | 364/491 X |
| 3,702,004 | 10/1972 | Eskew et al. | 364/489 X |
| 3,794,983 | 2/1974 | Sahin | 364/488 |
| 3,974,481 | 8/1976 | Ledieu et al. | 364/489 |
| 4,218,745 | 8/1980 | Perkins | 364/489 |

FOREIGN PATENT DOCUMENTS

| | | | |
|---|---|---|---|
| 57-106050 | 1/1982 | Japan | 364/489 |
| 59-189471 | 10/1984 | Japan | 364/489 |
| 60-8982 | 1/1985 | Japan | 364/489 |
| 2131577 | 6/1984 | United Kingdom | 364/489 |

OTHER PUBLICATIONS

"Electrostatic Analog for Finding Nonintersecting Paths", by V. D. Agrawal Students Journal, The Institute of Electronics & Telecommunication Engineers, (India) vol. 20, No. 1, (1979) pp. 3–7.

*Applied Numerical Analysis* by G. F. Gerald, Addison–Wesley Publishing Co., 1970, pp. 346–361.
*Graph Algorithms* by S. Even, published by Computer Science, 1979, pp. 135–138.
*The Shortest Path Through a Maze* by E. F. Moore, published in the annals of the *Computation Laboratory of Harvard Univ.*, 1959.
*An Algorithm for Path Connections and Its Applications* by C. Y. Lee, published in the Bell System Tech. Publication Monograph No. 4017, Dec. 1961.
*A Modification of Lee's Path Connection Algorithm* by S. B. Akers, Jr., published in the *IEEE Transactions on Electronic Computers*, 1967, pp. 97–98.

Primary Examiner—Mark Rosenbaum
Assistant Examiner—Carl J. Arbes
Attorney, Agent, or Firm—R. B. Levy

[57] ABSTRACT

The routing of non-crossing conductive paths (24—24) between each of two families of conductive nodes (18—18) and (20—20) on a surface (15) of a substrate (14) can be facilitated using electrostatic analog. To route the conductive paths (24—24), a two dimensional electrostatic force field is mathematically simulated on the surface (15) by attributing an equal charge to each of the nodes (18—18) of one family opposite that attributed to the nodes (20—20) of the other family, such that the total sum of the charges is zero. Lines of electric flux within the simulated force field are located and a set of flux lines, which link one of the nodes in one family to a separate node in the other family, is then selected. The flux lines in the set are non-crossing because of the properties of the simulated electric field and further a 1:1 matching between nodes (18—18 and 20—20) by the selected set of flux lines is guaranteed. Therefore the pattern of flux lines in the set can be employed to establish a pattern for the paths (24—24).

6 Claims, 7 Drawing Figures

ROUTING ROUTINE

METHOD FOR ROUTING CIRCUIT BOARDS

TECHNICAL FIELD

This invention relates to a method for routing conductive paths on the surface of a circuit board between two families of conductive nodes thereon.

BACKGROUND OF THE INVENTION

The testing of a printed circuit board, populated with components to form a circuit pack which performs one or more electronic functions, is generally accomplished by the use of automatic testing equipment. A typical automatic testing machine comprises a plurality of electronic circuits, each coupled to a particular one of a plurality of test points on the bottom of the circuit board, each connected to one or more component leads. Signals from the testing machine are launched into selected test points on the circuit board, causing the circuit pack to produce signals in response thereto. The signals produced by the circuit pack are then received by the testing machine from other test points on the circuit board. By monitoring the response of the circuit pack to the signals launched therein, the automatic testing machine can verify the operation of the circuit pack.

In practice, the electronic circuits of the testing machine are coupled to the selected test points on the bottom surface of the circuit board under test via a strip line board. Typically, the strip line board takes the form of a substrate (e.g., glass epoxy) whose upper and lower major surfaces are metallized. On the upper major surface of the substrate is a first and second family of conductive areas or nodes. Each of the nodes of the first family is connected to the automatic testing machine. The nodes of the second family are spatially arranged the same as the selected test points on the undersurface of the circuit board which are to be connected to the automatic testing machine. Upstanding pins or other suitable means are provided to connect each node of the second family to a corresponding test point on the undersurface of the circuit board.

A plurality of conductive paths are provided on the upper major surface on the strip line board to connect each node of the first family to a separate one of the nodes of the second family. Which of the nodes of the second family is connected to a particular one of the nodes of the first family is not important. Each node of the second family, which is connected to an individual circuit of the testing machine, can be connected to any one of the nodes of the first family. This is because each of the individual circuits of the testing machine can be assigned arbitrarily to a particular one of the nodes of the second family.

The process of routing or establishing the location of the conductive paths on the upper major surface of the strip line board has been a time consuming procedure. Present day routing techniques rely on a variety of heuristics, none of which typically provides a complete solution to the routing problem Often, significant manual effort is required to complete the routing of the conductive paths on the strip line board. A different strip line board is usually required to test each different type of circuit pack because the spatial arrangement of the test points thereon is unique to the type of circuit pack being tested. Therefore, it is extremely useful to be able to route strip line boards in a rapid, efficient manner.

To make the task of routing easier, present day strip line boards are often comprised of two or more individual layers laminated together. Each layer has a plurality of parallel, spaced apart conductive metal strips or paths thereon perpendicular to the conductive paths on each adjacent layer. Through-plated holes (vias) are provided in each layer to connect one or more of the conductive paths thereon to a path on an adjacent layer to establish the desired route of the paths between vias. The grid-like arrangement of the conductive paths on a laminanted strip line board is often referred to as a "Manhattan" geometry because of the analogy to intersecting city streets and avenues. Laminated strip line boards are expensive and time consuming to route.

One solution to the problem of routing conductive paths between each of two families of conductive nodes on a circuit board has been proposed by V. D. Agrawal of AT&T Bell Laboratories, in his paper "Electrostatic Analog for Finding Nonintersecting Paths", Students Journal, *The Institute of Electronics and Telecommunication Engineers* (India) Vol. 20, No. 1 (1979) at pages 3–7. Agrawal employs a computer to simulate an electrostatic force field on the circuit board between a preselected node in a first family (which is assigned a positive potential) and the boundaries of the board (which are attributed a ground potential). Any obstructions on the board such as screw holes are also attributed a ground potential. The electric field lines within the simulated electrostatic force field, which emanate from the preselected node and terminate at one of the boundaries, are then plotted. The shortest route between the preselected node in the first family, and any one of the nodes in the second family can be represented by the highest potential electric field line passing therebetween.

Once a conductive path is established between the preselected node in the first family and a node in the second family, another node in the first family is preselected. Then, the above-described process of locating the path between the preselected node and one of the nodes in the second family is repeated. After a path has been routed between each node in the first family and a separate one of the nodes in the second family, then the routing the problem has been solved.

Agrawal's technique of routing conductive paths on the circuit board requires that the nodes of the first family be preselected in some fashion. The order in which the nodes of the first family are preselected is important. It is possible that by preselecting one node before another, the resultant conductive paths obtained using Agrawal's routing technique may actually cross. The crossing of conductive paths on the strip line board cannot be tolerated since any crossing paths will produce an undesirable short circuit and impair the testing of a circuit pack.

Accordingly, there is a need for a technique for automatically routing conductive paths between each of two families of nodes on a substrate in a rapid and efficient manner.

SUMMARY OF THE INVENTION

The above-described disadvantages are substantially overcome by the instant method for routing conductive paths on the surface of a substrate between each of two families of conductive nodes thereon. The method is initiated by mathematically simulating a two-dimensional electrostatic force field on the surface of the substrate by attributing a charge to each of the nodes in one family opposite to that attributed to the nodes in the other family so that the total sum of the charges on the nodes is zero. Next, lines of electric flux within the simulated electrostatic force field are located. Once all the lines of flux have been located, a subset of lines which each link a separate one of the nodes in one family to a separate one of the nodes in the other family is selected. Each of the conductive paths on the circuit board is then routed to coincide with the location of a separate one of the selected flux lines within the subset.

DETAILED DESCRIPTION

Figure 1:
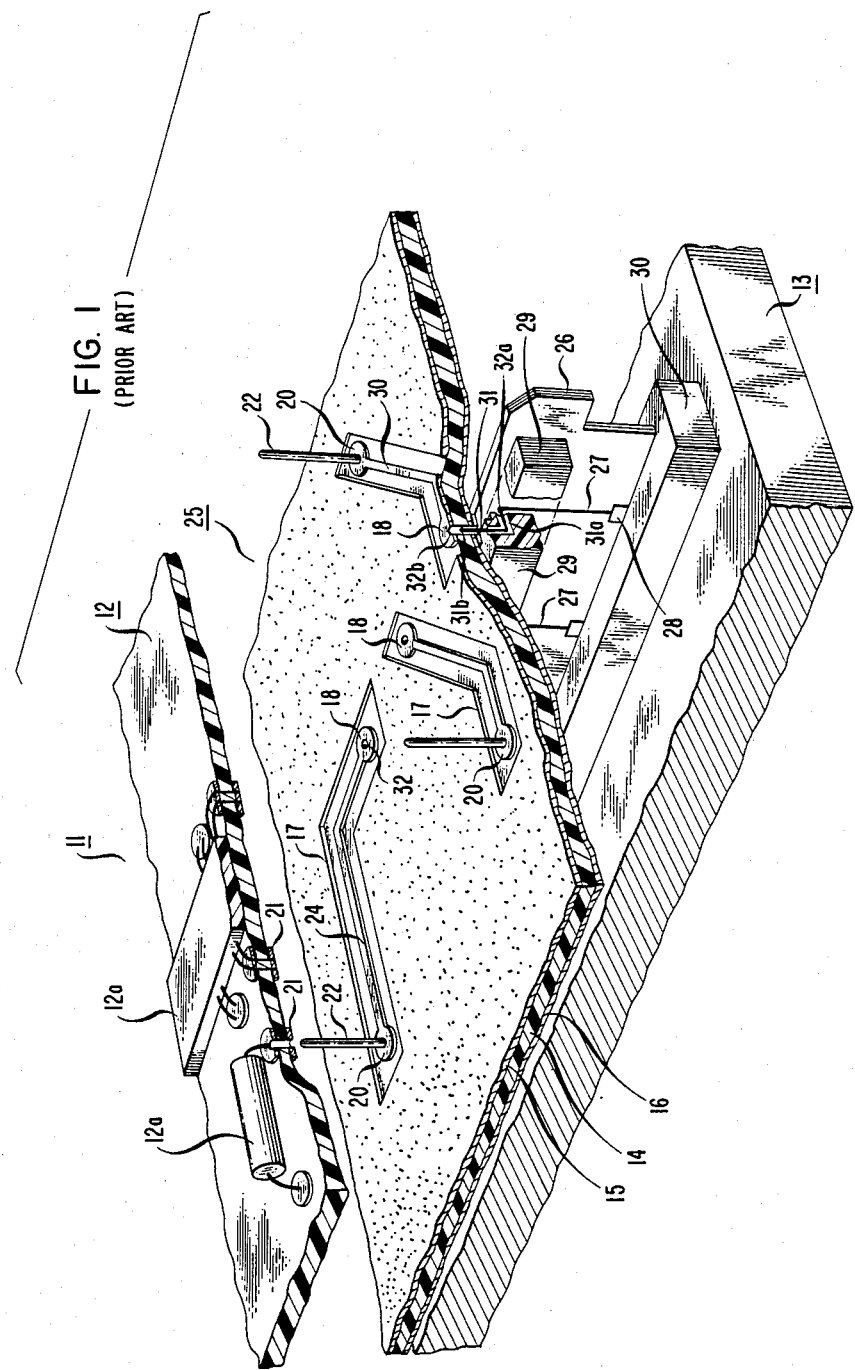
FIG. 1 is a perspective view of a strip line board having a plurality of conductive paths thereon which are routed between each of two families of nodes on the surface of the board.

FIG. 1 is a perspective view of a strip line board 10, according to the prior art, for connecting a circuit pack 11, comprised of a circuit board 12 populated with components 12a—12a, to an automatic testing machine 13, only a portion of which is shown. In an exemplary embodiment, the testing machine 13 takes the form of the model L-200 circuit tester manufactured by Teradyne Corporation, Boston, Mass.

The strip line board 10 comprises a substrate 14 (e.g., glass epoxy) having upper and lower metallized major surfaces 15 and 16. The metallized surface 15 has a plurality of areas 17—17 which are nonmetallized. Within each nonmetallized area 17—17 is one of a first family of conductive nodes 18—18 and one of a second family of conductive nodes 20—20. Each node of 18—18 and 20—20 comprises a circular area of metallization typically 0.0625" in diameter The number of nodes 18—18 and 20—20 in each of the families is typically identical and depends on the number of test points 21 on the undersurface of the circuit board 12 which are to be coupled to the automatic testing machine 13. Each test point 21 is coupled to one or more components 12a—12a on the circuit board 12. For ease of discussion, only three nodes 18—18 and three nodes 20—20 are illustrated in FIG. 1.

The nodes 20—20 are spatially arranged the same as the test points 21—21 on the undersurface of the circuit board 12 which are to be coupled to the testing machine 13. Each node 20 is electrically coupled to one of the selected test points 21—21 by one of a plurality of upstanding conductive pins 22—22. A separate one of a plurality of conductive paths 24—24, each formed of a thin (e.g., 0.025" wide) strip of metallization, is located within each nonmetallized area 17, and electrically connects the node 18 therein to the node 20. The metallization on the surface 15 which surrounds the nonmetallized areas 17—17 forms a ground plane 25 which advantageously surrounds the conductive paths 24—24.

Each of the nodes 18—18 is coupled to the testing machine 13 via one or more paddle cards 26—26 (only one being shown) which are each vertically interposed between the undersurface 16 of the substrate 14 and the testing machine 13. Each paddle card 26, which is made from glass epoxy or the like, has a plurality of metallized leads 27—27 thereon. The lower end of each lead 27 terminates at a metallized pad 28 at the bottom edge of the paddle card 26. The upper end of the leads 27—27 is covered by a plastic insulation strip 29 which is attached to upper edge of the paddle card 26.

The lower edge of the paddle card 26 is dimensioned for mating in a connector 30 on the testing machine 13. Within the connector 30 are metal fingers (not shown) which each make electrical contact with one of the pads 28—28 on the paddle card 26 so as to connect the pads to a separate circuit (not shown) in the testing machine.

Embedded within the plastic strip 29 at the upper edge of the paddle card 26 are a plurality of right angle leads 31—31, only one of which is shown. One end 31a of each lead 31 protrudes horizontally through the strip 29 towards the paddle card 26 for bonding to a plated aperture 32a extending therethrough at the top of one of the leads 27—27. The other end 31b of each lead 31 extends upwardly from the strip 29 and partially into an aperture 32b extending through the suostrate 14 so as to be centrally located within a separate one of the nodes 18—18. Each aperture 32b is plated to allow solder bonding of the end 31b of the lead 31 thereto. The opening (not shown) into each of the apertures 32b—32b through the surface 16 is separated from the layer of metallization on that surface by one of a plurality of nonmetallized areas (not shown).

The leads 27—27 on the paddle card 26 and the leads 31—31 embedded in the plastic strip 29 serve to carry signals between the testing machine 13 and the nodes 18—18. The paths 24—24 on the surface 15 carry signals between the nodes 18—18 and the nodes 20—20 which are connected by the pins 22—22 to selected test points 21—21 on the circuit board 12. In this way signals are communicated between the circuit pack 11 and the testing machine 13 to allow for circuit pack testing.

A major problem associated with the fabrication of the strip line board 10 arises in laying out the pattern of metallization on the surface 15. The location of the nodes 20—20 on the surface 15 is dictated by the location of the test points 21—21 on the circuit board 12 to which signals from the testing machine 13 are to be coupled. The location of nodes 18—18 is determined by the position of the paddle cards 26—26. For this reason, the nodes 18—18 are located in spaced rows, each overlying a respective one of the paddle card 26—26. What must be determined is the pattern of the paths 24—24, which determines the shape of the nonmetallized areas 17—17.

An important criterion in routing or locating the conductive paths 24—24 is that they must not cross, otherwise, a short-circuit will occur which will adversely affect the testing of the circuit pack 11. Often the signals passing along each of the paths 24—24 may have a frequency as high as 10 MHz or higher, so that the length of each path should be kept as short as possible to avoid signal losses and spurious radiation. Present day techniques for routing the conductive paths 24—24 on the surface 15 of the strip line board 10 are time consuming and often require a great deal of manual effort, making the fabrication of the strip line board 10 a slow and expensive process.

Figure 2:
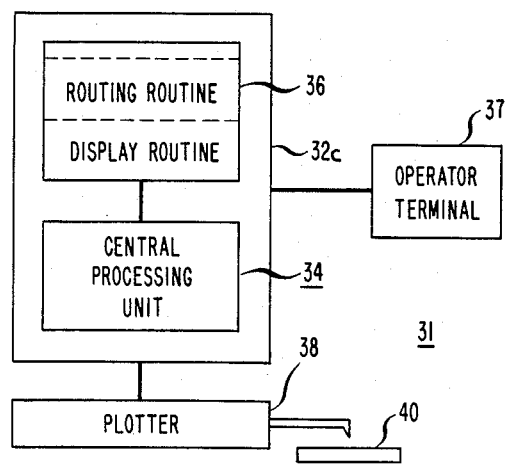
FIG. 2 is a block schematic diagram of an apparatus for the routing of the paths on the strip line board of FIG. 1 in accordance with the present invention.

In order to route the conductive paths 24—24 in a rapid and an efficient manner, an apparatus illustrated in FIG. 2, was developed for this purpose. The routing apparatus comprises a digital computer 32c, which, in an exemplary embodiment of the invention, comprises a Model 3B20 computer manufactured by AT&T, Morristown, N.J. The computer 32c includes a central processing unit 34 coupled to a memory 36 which stores a routing routine, further described with respect to FIG. 3, for determining the pattern of the paths 24—24 on the surface 15 of FIG. 1. In practice, the routing routine is entered into the memory 36 via an operator terminal 37 together with data indicative of the relative location of the nodes 18—18 and 20—20 on the surface 15 of FIG. 1.

The pattern of the paths 24—24 determined by the central processing unit 34 during execution of the routing routine, together with the pattern of nodes 18—18 and 20—20, is output to a plotter 38. The plotter 38 plots the pattern of paths 24—24 and the pattern of nodes 18—18 and 20—20 as dark (essentially opaque) lines and dots, respectively, on a transparency 40 referred to as an art master. In an exemplary embodiment, the plotter 38 may be a Model LD1 laser art master generator, manufactured by Gerber Corporation, Tustin, Calif. When the plotter 38 is a laser art master generator, the art master 40 takes the form of a sheet of light sensitive photographic film which, when developed, becomes a transparency having dark images thereon.

The pattern of dark images on the art master 40 can be replicated on the surface 15 of the substrate 14 to define the desired pattern of metallization thereon by the process of photolithography. In practicing the process of photolithography, the surface 15, which is initially completely metallized, is coated with a layer of positive photoresist (not shown). The photoresist is then selectively exposed to light through the art master 40. Those areas on the resist which are exposed to light can later be etched away together with the metallization therebeneath, leaving a pattern of metallization on the surface 15 corresponding to the dark images on the art master 40.

The pattern of dark images or the art master 40 correspond to the pattern of the nodes 18—18 and 20—20 and the paths 24—24. Therefore the pattern of metallization obtained on the surface 15 by the photolithography process using the art master 40 as a mask, will likewise be identical. However, since it is desired to provide a pattern of metallization on the surface 15 which not only represents the pattern of the nodes 18—18 and 20—20 and the conductive paths 24—24 but that of the ground plane 25 as well, a more complex procedure is required. In order to create the pattern of metallization on the surface 15 corresponding to the nodes 18—18 and 20—20, the conductive paths 24—24, and the ground plane by the process of photolithography, it is necessary to superimpose four separate art masters 40—40 as described hereinafter to provide a transparency having the desired pattern of dark images thereon.

In addition to storing the routing routine, the memory 36 also stores a display routine which typically takes the form of the "MAGIC TM -2" document support system produced by AT&T, Morristown, N.J. The display routine, when executed by the central processing unit 34, graphically displays on the operator terminal 37 the pattern of the nodes 18—18 and 20—20 and the pattern of paths 24—24, routed during execution of the routing routine.

Figure 3:
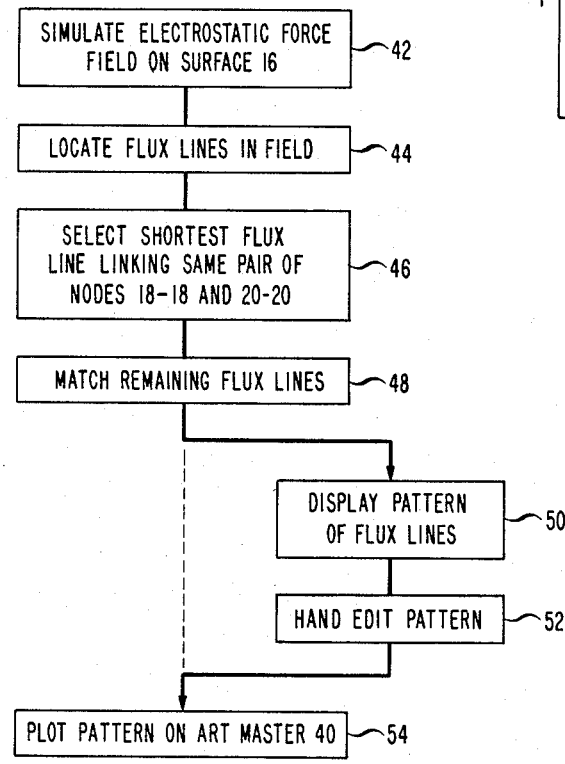
FIG. 3 is a flow chart representation of the steps of the process practiced by the apparatus of FIG. 2.

FIG. 3 is a flow chart representation of the routing routine stored in the memory 36 of FIG. 2. The routing routine, when executed by the central processing unit 34 of FIG. 1, accomplishes routing of the conductive paths 24—24 using an electrostatic analog. In other words, the physical properties of an electric field are applied to the problem of finding the location of the paths 24—24 of FIG. 1. The first step in routing the paths 24—24 of FIG. 1 is to simulate a two-dimensional electrostatic force field on the surface 15 of the substrate 14 of FIG. 1 (Step 42). The central processing unit 34 of FIG. 2 accomplishes this task mathematically by attributing equal but opposite electrostatic charges to the nodes 18—18 and 20—20, respectively. Typically each of the nodes 18—18 is arbitrarily assigned a positive charge while the nodes 20—20 are each assigned a negative charge. Since the number of nodes 18—18 and 20—20 is equal, the total sum of the charges is zero.

Next, the central processing unit 34 of FIG. 2 locates each of the lines of electric flux within the force field simulated on the surface 15 (Step 44). In order to locate the lines of flux, it is necessary to determine the electric potential $\Phi$ within the region. To simplify this task, the finite difference method is employed to find the potential at each of a plurality of equally spaced grid points, each referenced by Cartesian coordinates (x,y).

The finite difference method provides that the value of the potential at each of the grid points can be expressed as the sum of the average of the potential at the four neighboring grid points plus the potential due to any charge distribution at the grid point itself. Mathematically this may be expressed as $$\Phi(x,y) = \tfrac{1}{4}[\Phi(x+h,y) + \Phi(x,y+h) + \Phi(x-h,y) + \Phi(x,y-h)] + 4\pi\rho(x,y)h^2 \quad (1)$$

where h is the distance to the nearest neighboring grid point and $\rho$ is the charge distribution at the grid point (x,y).

For ease of computation, h is set equal to unity since only the relative spacing, rather than the actual distance, between the grid points is of concern The equation for the potential at each grid point is solved iteratively with the equation for the potential at every other grid point until convergence is reached. Convergence is reached when $\Phi_{n+1}(x,y)$, the potential calculated for each grid point during the n+1 iteration is approximately equal (within a small tolerance value), to the value of $\Phi_n(x,y)$ calculated during the $n^{th}$ iteration, where n is an integer. For a further description of the finite difference method of calculating the potential in an electrostatic force field, reference should be made to the text *Applied Numerical Analysis* by G. F. Ford, Addison-Wesley Publishing Company, Reading, Mass. (1970) at pages 154-156 and 207-208, herein incorporated by reference.

Since the surface 15 on the substrate 14 of FIG. 1 has finite boundaries through which no paths 24—24 are to pass, it is desirable that the electrostatic force field simulating the surface have finite boundaries through which no flux lines pass. Further, to represent obstructions, such as screw holes, for example, on the surface 15 through which no paths 24—24 can pass, it is desirable to create bounded regions within the field through which no flux lines can pass. For purposes of simplicity the boundaries within and surrounding the simulated electrostatic force field are assumed to pass midway between grid points.

Since no electric flux lines are to pass through the boundaries of the simulated electrostatic force field, then $(\partial \Phi/\partial n)$, the rate of change of the potential at, and normal to the boundary must be zero. In order to establish a boundary which, for example, passes through the coordinates $(x+h/2,y)$ so that $\partial \Phi/\partial n$ at that point is zero, the term $\Phi(x+h,y)$ representing the potential associated with the grid point $(x+h,y)$ lying outside the boundary is replaced in equation (1) with the term $\Phi(x,y)$, representing potential at the closest grid point $(x,y)$ inside the boundary. At a corner boundary, each of the terms $(x+h,y)$ and $\Phi(x,y+h)$, representing the potential associated with a respective one of the two grid points lying outside the boundary is replaced in equation (1) with the term $\Phi(x,y)$.

Once the potential at each of the grid points $(x,y)$ within the simulated electrostatic force field of FIG. 1 has been calculated, using equation (1), the location of each flux line within the field can then be determined. Each line of electric flux within the simulated electrostatic force field is everywhere orthogonal to a line of constant potential. By definition, each line of constant potential can be expressed as a parametric curve $X^{eq}(t)$, $y^{eq}(t)$ (where t is the position along the curve) which obeys the differential equation:

$$\frac{d\Phi[x^{eq}(t),y^{eq}(t)]}{dt} = 0 \qquad (2)$$

Equation (2) can also be written as $$\Phi_x \frac{dx^{eq}(t)}{dt} + \Phi_y \frac{dy^{eq}(t)}{dt} = 0$$

where $\Phi_x$ and $\Phi_y$ are given by $\frac{\partial \Phi}{\partial x}[x^{eq}(t),y^{eq}(t)]$ and $\frac{\partial \Phi}{\partial y}[x^{eq}(t),y^{eq}(t)]$, respectively.

Each line of flux can be represented as a parametric curve $Z(t)$ where $Z(t)$ is given by $$Z(t)=[x(t), y(t)] \qquad (3)$$

Since each line of flux $Z(t)$ is everywhere orthogonal to each line of constant potential $[x^{eq}(t), y^{eq}(t)]$, each flux $Z(t)$ line must obey the equation $$\Phi_y \frac{dx(t)}{dt} - \Phi_x \frac{dy(t)}{dt} = 0 \qquad (4)$$

The parameter t can be made to denote the arc length along the parametric curve $Z(t)$ if the following condition is imposed:

$$\left(\frac{dx(t)}{dt}\right)^2 + \left(\frac{dy(t)}{dt}\right)^2 = 1 \qquad (5)$$

The condition imposed by equation (4) can be achieved by assigning the derivatives dx/dt and dy/dt the following values:

$$\frac{dx}{dt} = \frac{\Phi_y}{\sqrt{\Phi_x^2 + \Phi_y^2}} \qquad (6)$$

$$\frac{dy}{dt} = \frac{\Phi_x}{\sqrt{\Phi_x^2 + \Phi_y^2}}$$

Figure 4:
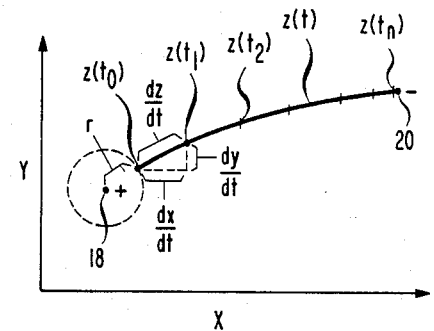
FIG. 4 illustrates how an electric flux line is located within the two-dimensional electrostatic force field simulated during the routing process of FIG. 3.

To obtain the curve $Z(t)$, and hence the flux line represented thereby extending between a pair of nodes 18—18 and 20—20, a starting point $Z(t_0)$ is first selected a small distance r (e.g., 0.010) from a particular one of nodes 18—18 as shown in FIG. 4. By convention, a flux line emanates from a positive charge and terminates on a negative charge hence, the reason for selecting the starting point adjacent to one of the nodes 18—18. From the starting point Z, the end point $Z(t_1)$ of the first small segment of the curve $Z(t)$ is obtained by marching forward using the expression:

$$Z(t_1) = Z(t_0) + \int_t^{t+\Delta} \frac{dz}{dt} dt \qquad (7)$$

where $\Delta$ is some small increment (e.g. 0.015″) and dZ/dt is given by (dx/dt), (dy/dt). The values of (dx/dt) and (dy/dt) can be calculated using equation (6) during the process of iteratively calculating the potential $\Phi(x,y)$ at each grid point.

The integral $\int_t^{t+\Delta} \frac{dz}{dt} dt$ can be approximated using the trapazoidal rule and the predictor corrector method.

The end points $Z(t_2), Z(t_3) \ldots Z(t_n)$ of each of the successive segments of the curve $Z(t)$ are obtained using equation (7) by substituting the value of the end point of each preceding line segment for the term $Z(t_0)$. The process of marching forward in this fashion continues until the end point, $Z(t_n)$ of the $n^{th}$ successive line segment coincides with, or is located very close to, one of the nodes 20—20. Note that the exact coordinates for the starting point $Z(t_0)$ can be arbitrarily selected (so long as r is small), because the terms (dx/dt) and (dy/dt) determine the direction of the curve $Z(t)$.

Figure 5:
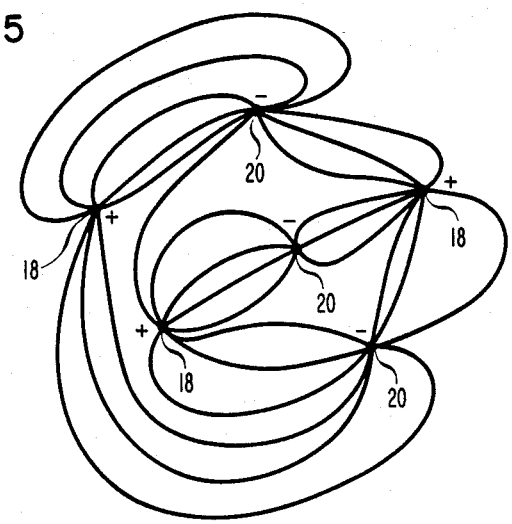
FIGS. 5-7 are graphical illustrations of the lines of electric flux within the simulated electrostatic force field simulated during various steps of the routing process of FIG. 3.

On average, the flux lines emanating from each node 18 terminate on from two to six nodes 20—20. To locate each of the flux lines terminating on each of the nodes 20—20, the above-described process of marching forward is repeated eight times with each new starting point spaced equidistant from each preceding starting point. Because of symmetry, only the flux lines that emanate from the nodes 18—18 need to be located. The flux lines located within the simulated electrostatic force field, when plotted, together with the pattern of nodes 18—18 and 20—20, appear as illustrated in FIG. 5.

It is possible to locate the flux lines within the simulated field using the exact same procedure by finding those flux lines emanating from the nodes 20—20 once the potential within the region has been determined. Note that the starting point $Z(t_0)$ will be a distance r from a node 20 and $\Delta$ has a negative value (e.g., −0.010). It may also be desirable in some instances to locate the flux lines leaving the nodes 20—20 in addition to locating those flux lines leaving the nodes 18—18.

Because of the imposed conditions that the total charge attributed to the nodes 18—18 equals that attributed the nodes 20—20, and that the flux lines within the simulated field do not cross the boundaries, there will be flux lines and they will not cross each other. Therefore, each flux line passing between one of nodes 18—18 and 20—20 represents a possible route for one of the paths 24—24 of FIG. 1.

Since the charge attributed to each of the nodes 18—18 is equal, then, because of the properties of the electric field, the flux lines leaving any subset of these nodes terminate on at least as many of the negatively charged nodes 20—20. As a result, a 1:1 linkage of each of nodes 18—18 and 20—20 by a separate one of the flux lines is guaranteed. However, the flux lines leaving the nodes 18—18 arrive at more than one of the nodes 20—20. Thus, some of the flux lines within the set depicted in FIG. 5 must be eliminated in order to obtain a subset of lines which uniquely link one of nodes 18—18 and 20—20 and therefore represent the desired routing of the conductive paths 24—24.

The problem of selecting such a subset of flux lines is identical to the problem in graph theory of finding a maximum cardinality bipartite match. Various algorithms for finding a maximum cardinality bipartite match are known in the art. The matching algorithm disclosed in the text *Graph Algorithms*, by S. Even, published by Computer Science, Potomac, Md., (1979) pages 135-138 (herein incorporated by reference) was chosen to find a subset of flux lines which uniquely link each of the nodes 18—18 to a particular one of the nodes 20—20.

In order to apply Even's matching algorithm, it is first necessary to group those flux lines linking the same pair of nodes 18—18 and 20—20 into sets and then to select a particular flux line in each set (Step 46). While any one of the flux lines within each set can be designated, it is preferable to select the shortest flux line. By selecting the shortest flux line in each set, the length of the paths 24—24 routed in accordance with the selected flux lines will be minimized.

Figure 6:
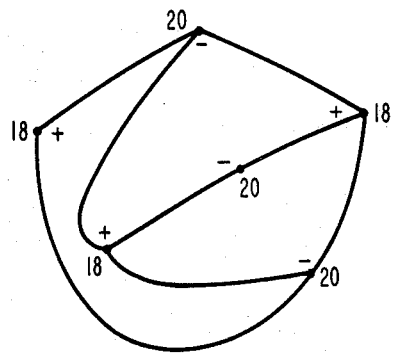

Once the shortest of the flux lines in each set is designated, the remaining lines in each set are then eliminated, by erasing the data in the memory 36 of FIG. 2 representing their location. If there is only one flux line in a particular set, the flux line is retained as being the shortest one in that set. The flux lines which remain in the simulated field after Step 46 appear as illustrated in FIG. 6.

The flux lines which remain after Step 46 are then matched (Step 48) using Even's algorithm. In other words Even's algorithm is applied to the set of flux lines remaining after Step 46 to obtain a subset which contains flux lines each linking one of the nodes 18—18 to a separate one of the nodes 20—20. The matching of flux lines is accomplished by Even's algorithm using an analogy to network flow. A flow network (not shown) is simulated in which each flux line in the set of lines remaining after Step 46 is made to represent a fluid-carrying conduit between a pair of nodes 18—18 and 20—20. The subset of flux lines in the simulated flow network which yields a maximum flow corresponds to those flux lines uniquely linking one of the nodes 18—18 to a separate one of the nodes 20—20.

Figure 7:
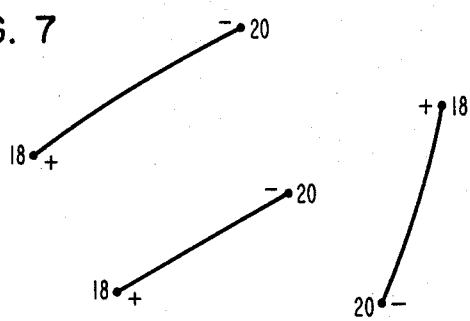

The process of matching the flux lines is accomplished during Step 48 in an iterative manner in order to find a set of lines, which link each of nodes 18—18 and 20—20. First, Even's algorithm is applied to match those lines which remain after Step 46. If a set of lines can be found which link the nodes 18—18 and 20—20, then the longest of the lines remaining after Step 46 is eliminated. Even's algorithm is then applied to determine if a subset of flux lines can be found from those remaining which link the nodes 18—18 and 20—20. This process is repeated with the longest of the flux lines remaining after Step 46 being successively eliminated until the existing set of lines can no longer be matched. Then, the longest flux line just having been eliminated is restored, and Even's algorithm is applied to obtain a set of lines linking the nodes 18—18 and 20—20 whose longest member's length is minimized. The flux lines which are present in the simulated electrostatic force field after the matching Step 46 are illustrated in FIG. 7.

Following Step 48, the pattern of the nodes 18—18 and 20—20 and the pattern flux lines which are present after matching may then be displayed on the operator terminal 37 (Step 50). Following Step 50, the pattern of flux lines may be hand-edited to optimize the pattern of the paths 24—24 represented by the flux lines. Note that both Steps 50 and 52, while desirable, are not critical to the execution of the routing routine of FIG. 3 and can be deleted without adverse effect.

Following Step 52, or following Step 48 when Steps 50 and 52 are deleted, the central processing unit 35 of FIG. 2 down loads data representing the location of nodes 18—18 and 20—20 and the pattern of flux lines remaining after matching, to the plotter 42 The plotter 42 plots the pattern of the nodes 18—18 and 20—20 and the pattern of the flux lines as dark circles and dark lines, respectively, on the art master 40 of FIG. 2 (Step 54).

The pattern of dark images plotted on the art master 40 corresponds to the pattern of metallization on the surface 15 (see FIG. 1) defining nodes 18—18 and 20—20 and the routes 30—30. However, there will be no dark area on the art master 40 corresponding to the pattern of metallization of the ground plane 25. To obtain a pattern of dark images the art master 40 which represents the entire pattern of metallization of the surface 15 of FIG. 1, it is necessary repeat Step 54 four times to produce not one, but four separate art masters 40—40.

Upon the initial execution of Step 54, the pattern of the flux lines is plotted on the first master 40 together with the pattern of the nodes 18—18 and 20—20. Each dark image on the first art master 40 representing one of the nodes 18—18 and 20—20 appears as a dark circle approximately 0.0625" in diameter Each dark image on the first art master 40 representing a flux line (and hence, one of the routes 24—24 of FIG. 1) appears as a strip 0.025" in width The dimensions of the dark images on the first art master 40 of the nodes 18—18 and 20—20 correspond exactly to the dimensions of the nodes and the paths 24—24, respectively, on the surface 15 of FIG. 1.

During the next execution of Step 54, the pattern of nodes 18—18 and 20—20 and the pattern of flux lines are again plotted on a second art master 40 as before. However, the size of dark images, representing the nodes 18—18 and 20—20 and the routes 24—24 is increased. Typically, the dimensions of the dark images which represent the nodes 18—18 and 20—20 and those dark images representing the routes 24—24 are made 0.050" larger than during the previous execution of Step 54.

Step 54 is reexecuted a third time to produce a third art master 40 which has a pattern of dark images corresponding to the pattern of nodes 18—18 and 20—20 only. Each dark image on the third art master 40 appears as a circle which is 0.0625" in diameter Upon the fourth execution of Step 54, a fourth art master 40 is produced which, like the third art master, contains a pattern of dark images thereon corresponding to the pattern of the nodes 18—18 and 20—20 only. However, the size of each dark image on the fourth art master 40 is made 0.050" larger than on the third art master.

The art master 40 produced during each of the second and fourth executions of Step 54 is then photographically negated. These two photographically negated art masters 40—40 are then superimposed on the two art masters produced during the first and third executions of Step 54. The resultant composite art master (not shown) obtained in this fashion will, when light is directed therethrough, produce a pattern of dark images corresponding to the pattern of metallization on the surface 15 of FIG. 1 defining the nodes 18—18 and 20—20, the paths 24—24, and the ground plane 25. Thus the composite art master can be used to create the desired pattern of metallization on tne surface 15 by the process of photolithography.

Routing the paths 24—24 on the surface 15 of FIG. 1 using the process of FIG. 3 can be accomplished relatively quickly. Even for a strip line board 10 which had several hundred nodes 18—18 and 20—20, only a few hours of computer time was required to route the paths 24—24 using the above-described electrostatic analog. While even a few hours of computer time may seem significant, this represents a dramatic savings in real time as compared to the days or weeks required to a route strip line board 10 using prior art techniques.

The routing method of the present invention can also be used to route a strip line board 10 having different numbers of nodes 18—18 and 20—20. Routing a strip line board 10 having N nodes 18—18 and M nodes 20—20 when N and M are each integers and M≦N can be accomplished in the same manner described above The only difference is that simulation of the two dimensional electrostatic force field is accomplished during Step 46 by attributing a negative potential to each node 20 equal to N/M of the charge attributed to each node 18. Since there are M−N fewer nodes 20—20 than there are nodes 18—18, only M of the nodes 18—18 will be linked to the nodes 20—20 by the flux lines within the field which remain after Step 48.

It is to be understood that the embodiments described herein are merely illustrative of the principles of the invention. For example, the method could also be used to route paths between nodes on or within a three-dimensional body. Various modifications may be made thereto by persons skilled in the art which will embody the principles of the invention and fall within the spirit and scope thereof.

What is claimed is:

1. A method for routing conductive paths between each of two families of nodes of a body comprising the steps of:

simulating an electrostatic force field between the two families of nodes by attributing an equal charge to each of the nodes of one family whicn is opposite in polarity to the point charge attributed to each of the nodes of the other family such that the total sum of the charges is zero;

locating lines of electric flux within the simulated electrostatic force field;

selecting, from the lines of electric flux, a subset of lines which each terminate at a separate one of the nodes in each family; and routing the conductive paths between the nodes of the two families such that each path coincides with a separate one of the selected subset of flux lines.

2. The method according to claim 1, wherein the selecting step comprises:

(a) grouping each of the flux lines which terminate at the same pair of nodes into separate sets;

(b) designating the shortest flux line within each and discarding the other lines in the set;

(c) eliminating the longest of the flux lines which remain and then finding a subset of flux lines which link the nodes in one family to a separate one of the nodes in the other family; and (d) repeating step (c) until a subset of flux lines cannot be found which link with nodes in one family to the separate one of the nodes in the other family.

3. The method according to claim 1 further including the steps of:

(a) displaying the pattern of the selected subset of flux lines; and (b) editing the pattern of the selected subset of flux lines to enhance the pattern of the conductive paths represented thereby.

4. A method for routing conductive paths on a substrate between each of two families of nodes thereon comprising the steps of:

simulating a two-dimensional electrostatic force field on the surface of the substrate by attributing an equal charge to each of the nodes of one family which is opposite to that attributed to each of the nodes of the other family such that the total sum of the charges is zero;

locating lines of electric flux within the force field;

designating the shortest flux line within each set of lines which terminate the same pair of nodes;

eliminating all the remaining lines within each set otherwise not designated;

successively eliminating the longest of the designated flux lines and then matching the flux lines that remain to obtain a subset of lines which link the nodes in the two families, the step of successively eliminating the longest of the designated flux lines and the matching of the lines that remain being repeated until one of the nodes in each family is no longer linked to a separate one of the nodes in the other family by a flux line; and routing conductive paths between the nodes of the two families so that each path coincides with the location of a separate one of the flux lines which each link a separate one of the nodes in the two families.

5. A method for plotting images on an art master which correspond to a pattern of routes linking each of a plurality of nodes in one family to a separate one of a plurality of nodes in another family comprising the steps of:

simulating an electrostatic force field between nodes of each of the two families by attributing a charge to each of the nodes in one family opposite to that attributed to the nodes of the other, such that the total sum of the charges is zero;

locating lines of electric flux within the simulated electrostatic force field;

selecting a set of lines of electric flux within the field which each terminates at a separate pair of nodes each in separate families; and plotting the pattern of the selected set of flux lines, together with the pattern of nodes on the art master.

6. The method according to claim 5, wherein the selecting step comprises:
(a) grouping each of the flux lines which terminate at the same pair of nodes into a separate set;
(b) designating the shortest flux line within each and discarding the other lines in the set;
(c) eliminating the longest of the flux lines which remain and then finding a subset of flux lines which link the nodes in one family to a separate one of the nodes in the other family; and
(d) repeating step (c) until a subset of flux lines cannot be found which link with nodes in one family to the separate one of the nodes in the other family.

* * * * *